United States Patent
Hefetz et al.

(10) Patent No.: US 9,554,489 B2
(45) Date of Patent: Jan. 24, 2017

(54) SYSTEMS FOR SIMPLIFYING A DETECTOR HEAD

(71) Applicant: General Electric Company, Schenectady, NY (US)

(72) Inventors: Yaron Hefetz, Alonim (IL); Gil Kovalski, Haifa (IL); Jean-Paul Bouhnik, Zichron Yaakov (IL)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/486,940

(22) Filed: Sep. 15, 2014

(65) Prior Publication Data
US 2016/0077216 A1    Mar. 17, 2016

(51) Int. Cl.
*H05K 7/20* (2006.01)
*G01T 1/164* (2006.01)

(52) U.S. Cl.
CPC ......... *H05K 7/20418* (2013.01); *G01T 1/1648* (2013.01)

(58) Field of Classification Search
CPC ....... G02B 6/06; G06F 3/005; G01N 21/6452; G01T 1/1648; H05K 7/20418
See application file for complete search history.

(56) References Cited

U.S. PATENT DOCUMENTS

| | | | | |
|---|---|---|---|---|
| 4,438,335 A | * | 3/1984 | Meeder | G01T 1/1648 250/363.05 |
| 5,213,152 A | * | 5/1993 | Cox | F28F 27/006 165/5 |
| 6,411,672 B1 | * | 6/2002 | Sasaki | A61B 6/4488 250/370.15 |
| 2006/0237652 A1 | * | 10/2006 | Kimchy | A61B 1/05 250/363.02 |
| 2010/0176270 A1 | * | 7/2010 | Lau | B25J 9/1692 250/203.2 |
| 2014/0187923 A1 | | 7/2014 | Heukensfeldt et al. | |
| 2014/0263984 A1 | * | 9/2014 | Hagen | G02B 6/06 250/227.11 |

OTHER PUBLICATIONS

Tsukerman, Leonid, "Methods and Systems for Controlling Movement of Detectors Having Multiple Detector Heads," U.S. Appl. No. 14/016,939, filed Sep. 23, 2013, 33 pages.
Bouhnik, Jean-Paul, "Systems and Methods for Controlling Motion of Detectors Having Moving Detector Heads," U.S. Appl. No. 14/040,108, filed Sep. 27, 2013, 46 pages.
Kovalski, Gil, "Imaging System Using Independently Controllable Detectors," U.S. Appl. No. 14/135,751, filed Dec. 20, 2013, 59 pages.
Levin, Ilan, "System and Method for Subject Shape Estimation," U.S. Appl. No. 14/278,091, filed May 15, 2014, 39 pages.

* cited by examiner

*Primary Examiner* — David Porta
*Assistant Examiner* — Faye Boosalis
(74) *Attorney, Agent, or Firm* — Alleman Hall McCoy Russell & Tuttle LLP (57) ABSTRACT

Various methods and systems are provided for a detector head for an imaging system. The detector head comprises a detector module comprising at least one detector element for detecting radiation and detector electronics, and a shaft to which the detector module is coupled, the detector module configured to rotate more than 360 degrees about the shaft in at least one direction.

16 Claims, 10 Drawing Sheets

SYSTEMS FOR SIMPLIFYING A DETECTOR HEAD

FIELD

The subject matter disclosed herein relates generally to medical imaging systems, and more particularly to Nuclear Medicine (NM) imaging systems.

BACKGROUND

In nuclear medicine imaging, systems with multiple detectors or detector heads may be used to image a subject. For example, the detectors may be positioned adjacent to the subject to acquire nuclear medicine imaging data (e.g., radioactivity), which is used to generate a three-dimensional (3D) image of the subject. In a specific example, Single Photon Emission Computed Tomography (SPECT) systems may have moving detector heads, such as gamma cameras, positioned to focus on a region of interest. One or more of the gamma cameras may be moved (for example, rotated) to different angular positions to acquire image data. The acquired image data may then be used to generate 3D images.

In conventional SPECT camera systems with multiple swinging detector heads, the detectors swing about a fixed pivot. The rotational movement of each detector head limits the size of the detector head, to ensure detector heads do not collide with one another during rotation. As a result, gaps may exist between the detectors to accommodate full rotational motion of the detectors. These gaps limit the number of detectors that can be used to focus on a region of interest of the subject and thus limit the sensitivity of the imaging system.

Furthermore, detector heads may include complex circuitry to enable a detector unit to communicate with a detector controller as well as data acquisition systems. As the detector head pivots, swings, or rotates, the large number of electrical wires providing power and communication abilities to the detector head may become tangled and/or strained and consequently break. As a result, the motion of the detector head may be limited by the wired circuitry. For example, a detector head may not be able to fully rotate 360 degrees, and so instead may stop and reverse direction to perform a continuous scan. Further, common solutions to prevent circuitry damage increase the size of the detector head. For example, a detector head may include a bulky absolute encoder so that the detector controller may know the orientation of the detector head at all times. As a result, the resolution of NM imaging system, which may be limited by the number of detector heads, is degraded since an increased size of each detector head decreases the number of imaging detectors that may fit in the NM imaging system.

BRIEF DESCRIPTION

In one embodiment, a detector head for an imaging system comprises a detector module comprising at least one detector element for detecting radiation and detector electronics, and a shaft to which the detector module is coupled, the detector module configured to rotate more than 360 degrees about the shaft in at least one direction.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 3:
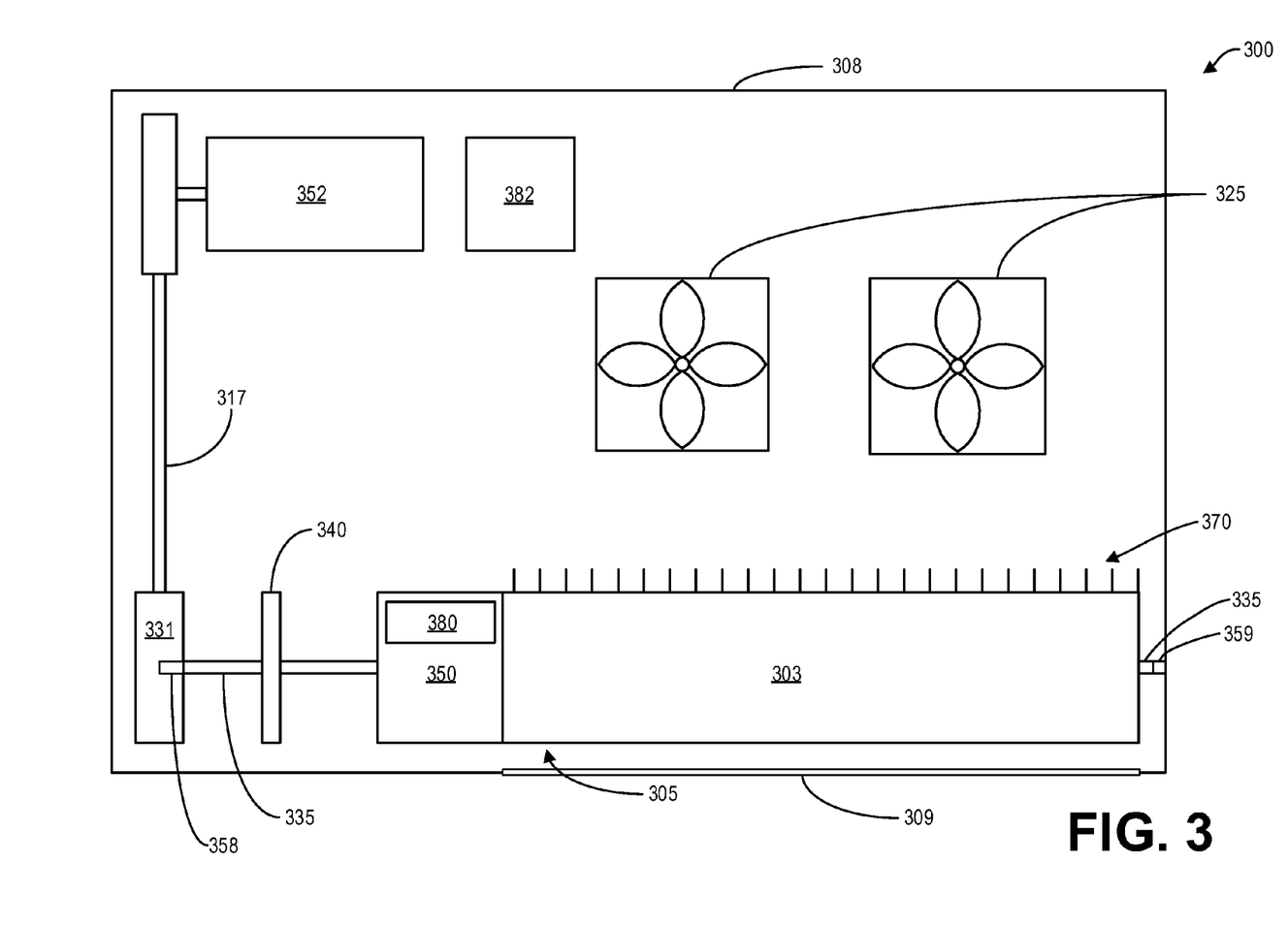
FIG. 3 shows a block diagram of a detector head according to an embodiment.
Figure 4:
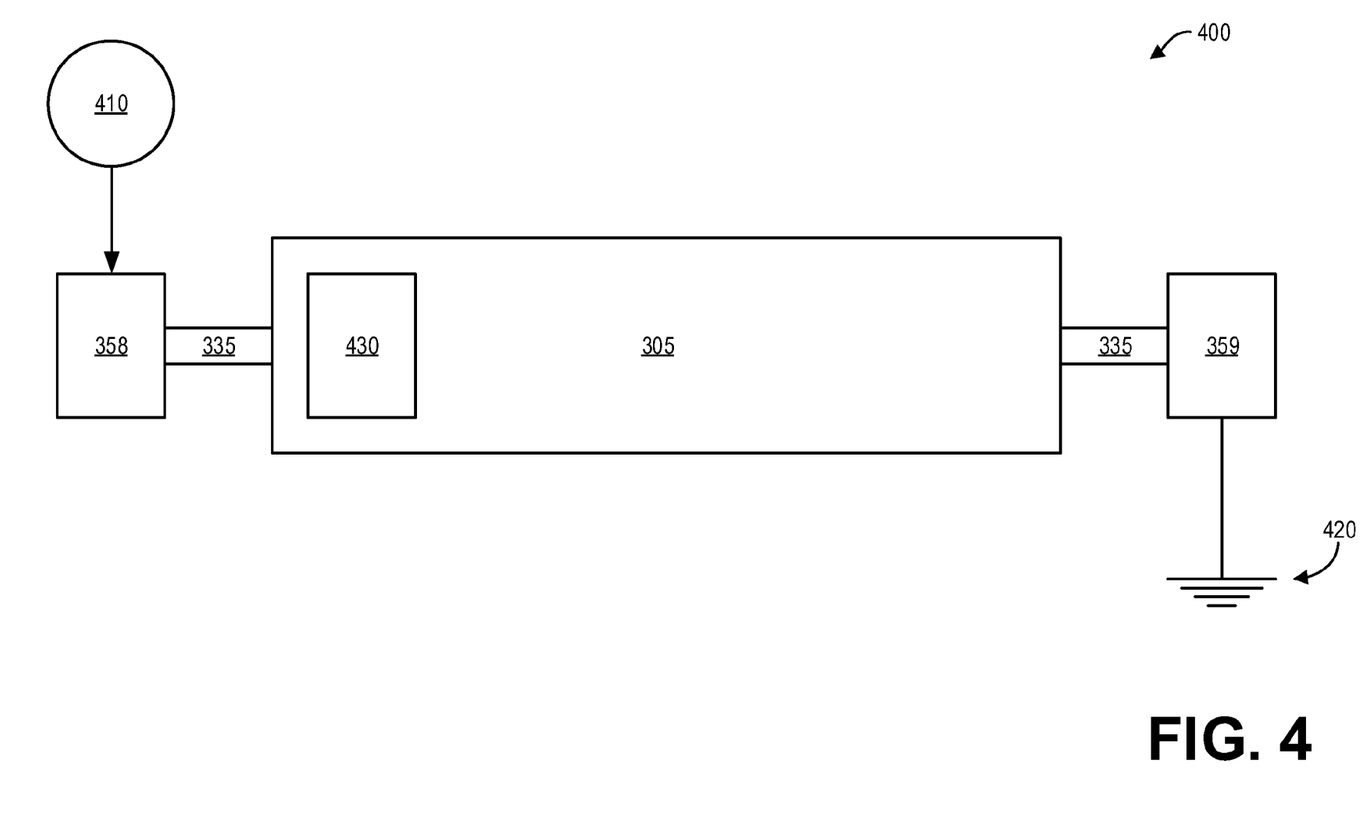
FIG. 4 shows a schematic diagram illustrating a detector head receiving power through a shaft according to an embodiment.
Figure 5:
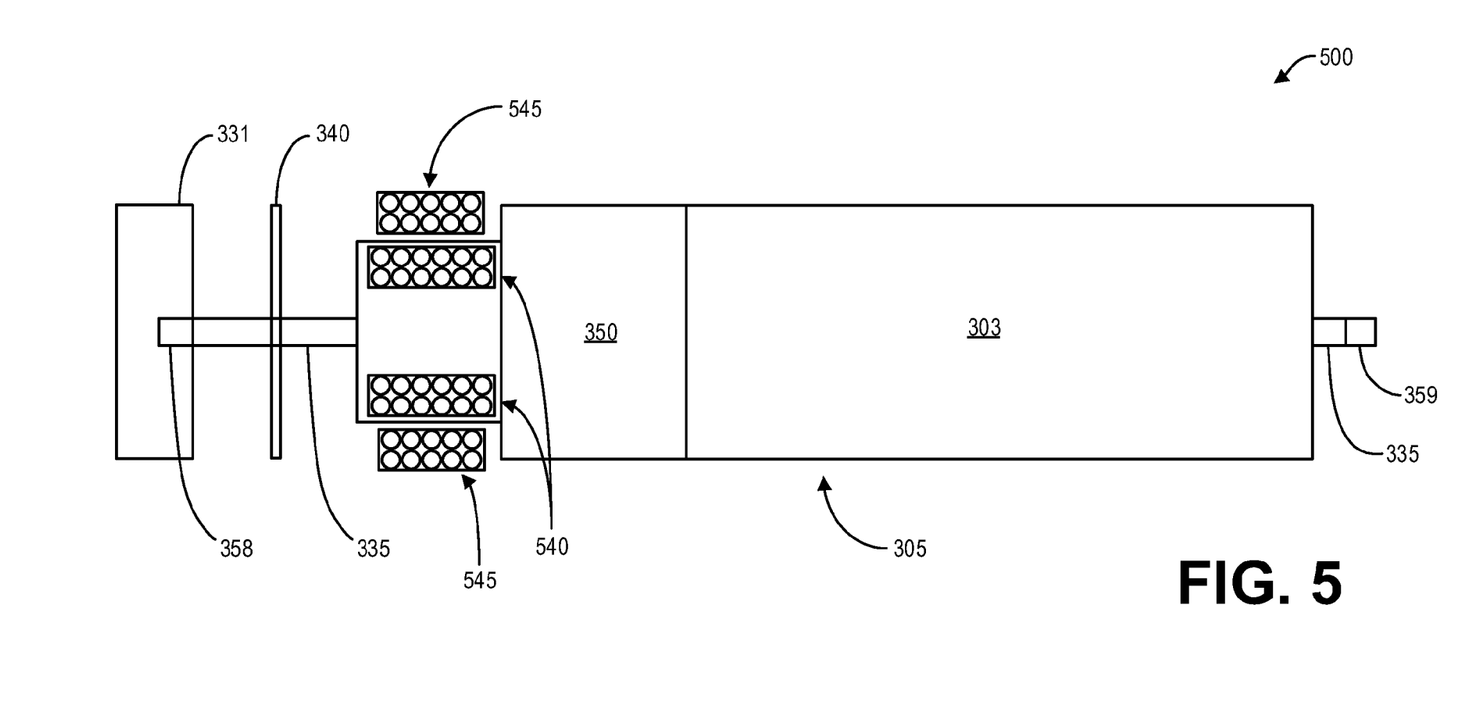
FIG. 5 shows a schematic diagram illustrating a detector head receiving power via inductive coupling according to an embodiment.
Figure 6:
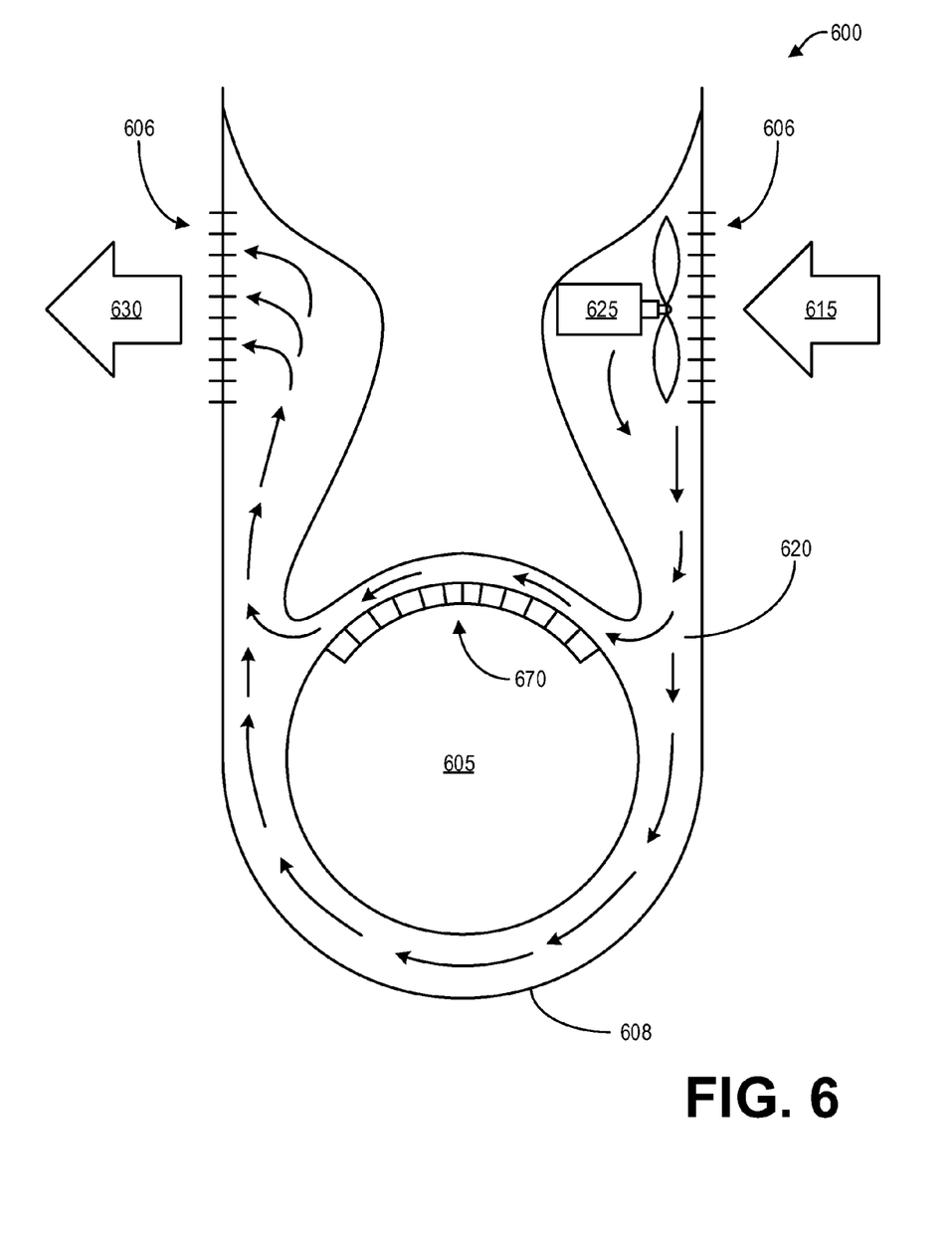
FIG. 6 shows a diagram illustrating air flow through a detector head according to an embodiment.

The following description relates to various embodiments of Nuclear Medical (NM) imaging systems. In particular, systems for a simplified detector head are provided. A Nuclear Medical imaging system, such as the system depicted in FIGS. 1A-1B, may include a plurality of detector heads mounted on a gantry. Each detector head may be attached to a column arm, such as shown depicted in FIG. 2 and FIG. 8, which may extend or retract to move the detector head closer to or further away from a subject being imaged. Each detector head may be further pivot, or rotate, while acquiring data. The detector material and detector electronics within may wirelessly receive electrical energy as shown in FIGS. 3-5. Heat generated by the detector head may be dissipated by using one or more fans and heat fins to circulate air throughout the detector head, as depicted in FIG. 6. Detector electronics within the detector head may wirelessly communicate with a data acquisition system to receive commands and to transmit data. Such improvements to detector heads enables a minimized brain reach, as shown in FIGS. 9A-9B.

Figure 1A:
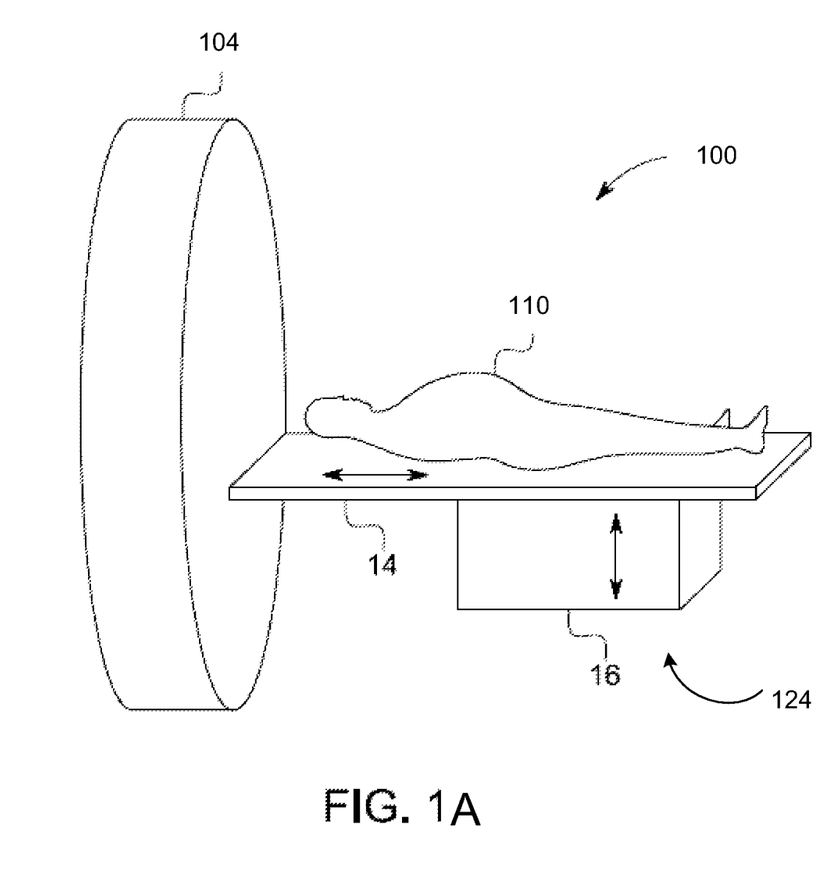
FIGS. 1A and 1B show schematic block diagrams of a Nuclear Medicine (NM) imaging system according to an embodiment.
Figure 1B:
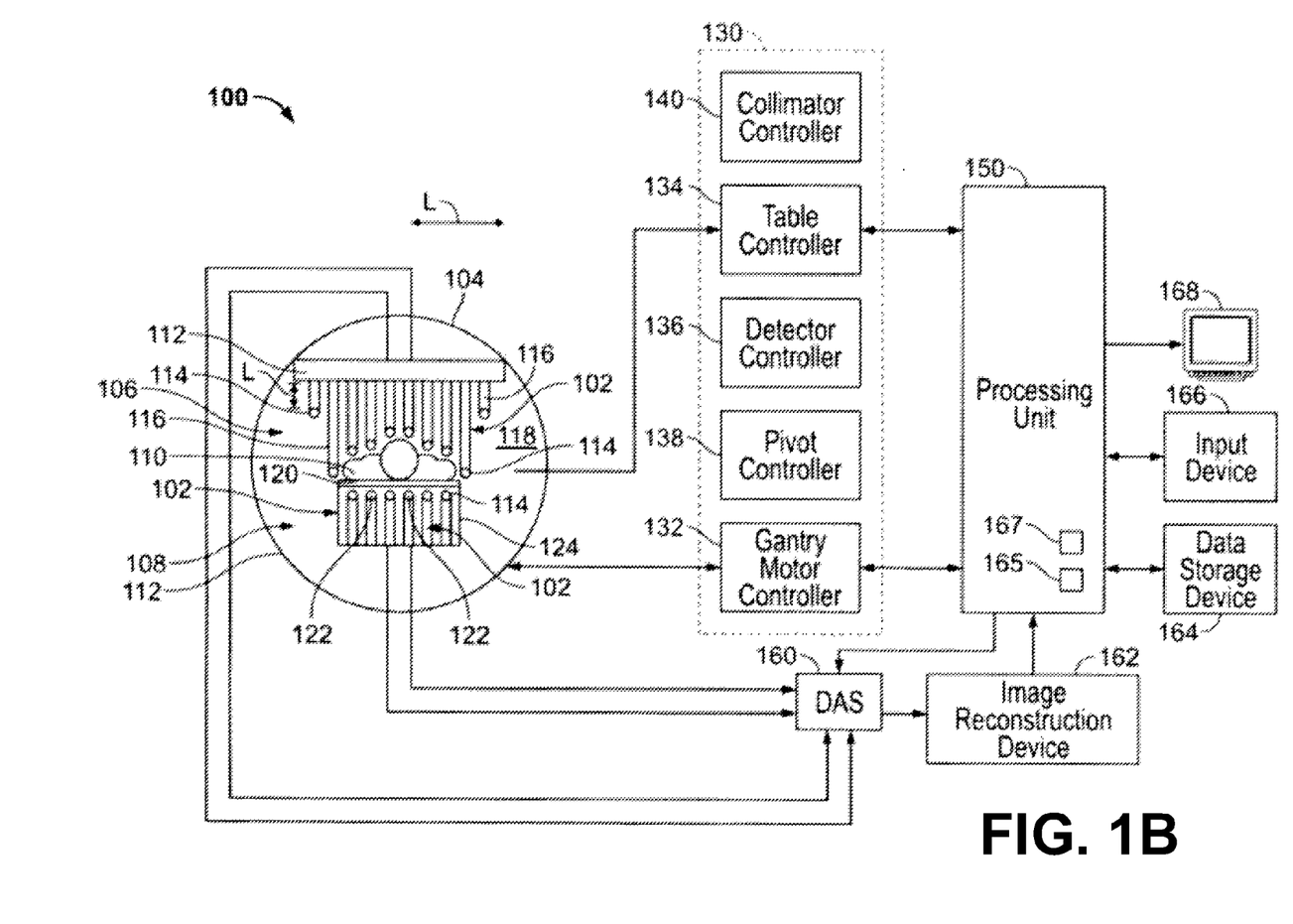

FIGS. 1A and 1B are schematic illustrations of a NM imaging system 100 having a plurality of imaging detectors mounted on a gantry. The movement of the imaging detectors is controlled to (i) reduce the likelihood or avoid collision among the moving imaging detectors and/or (ii) reduce the likelihood of one imaging detector obstructing the field of view of another imaging detector. For example, the NM imaging system in some embodiments provides coordinated swinging or rotating motion of a plurality of imaging detectors or detector heads.

The NM imaging system 100 may include a subject 110, such as a human patient in one embodiment. It should be noted that the subject 110 does not have to be human. It can be some other living creature or inanimate object in various embodiments. The subject 110 can be placed on a support structure 124 including a pallet 14 that can move a subject horizontally for locating the subject in the most advantageous imaging position. A bed mechanism 16 can raise and lower the pallet 14 vertically for locating the subject in the most advantageous imaging position. A gantry 104 is shown as circular in one embodiment. In other embodiments the gantry 104 may be of any shape such as square, oval, "C" shape, or hexagonal.

In particular, as shown in FIG. 1B, a plurality of imaging detectors 102 are mounted to gantry 104 and/or patient support structure 124 (for example, within the patient support structure 124 under a patient table 120), which may define a table support for a patient table 120. In the illustrated embodiment, the imaging detectors 102 are configured as two separate detector arrays 106 and 108 positioned above and below the subject 110 (for example, a patient), as viewed in FIG. 1B. The detector arrays 106 and 108 may be coupled directly to the gantry 104 and/or patient support structure 124, or may be coupled via support members 112 thereto, to allow movement of the entire arrays 106 and/or 108 relative to the gantry 104 (for example, translating movement in the left or right direction as viewed in FIG. 1B) or the patient support structure 124 (for example, swinging or rotating movement under the subject 110). Additionally, each of the imaging detectors 102 includes a detector head 114, at least some of which are mounted to a movable detector carrier 116 (for example, a support arm or actuator that may be driven by a motor to cause movement thereof) that extends from the gantry 104 or within the patient support structure 124. In some embodiments, the detector carriers 116 allow movement of the detector heads 114 towards and away from the subject 110, such as linearly. Thus, in the illustrated embodiment the detector arrays 106 and 108 are mounted above and below the subject 110 and may allow linear movement of the detector heads 114 (indicated by the arrow L), such as generally parallel to the patient table 120 in one embodiment. However, other configurations and orientations are possible as described herein, as well as different types of movements (for example, transverse or perpendicular movement relative to the patient table 120). It should be noted that the movable detector carrier 116 may be any type of support that allows movement of the detector heads 114 relative to the support member 112, gantry 104, and/or patient support structure 124, which in various embodiments allows the detector heads 114 to move linearly towards and away from the support member 112, such as radially inward and outwards for positioning adjacent the subject 110. For example, as described herein, the detector heads 114 may be controlled to move independently of each other towards or away from the subject 110, as well as capable of rotational, pivoting, or tilting movement in some embodiments.

Each of the imaging detectors 102 in various embodiments is smaller than a conventional whole body or general purpose imaging detector. A conventional imaging detector may be large enough to image most or all of a width of a patient's body at one time and may have a diameter of approximately 50 cm or more. In contrast, each of the imaging detectors 102 may include one or more detector heads 114 coupled to a respective detector carrier 116 and having dimensions of 4 cm to 20 cm and may be formed of Cadmium Zinc Telluride (CZT) tiles or modules. For example, each of the detector heads 114 may be 8×8 cm in size and be composed of a plurality of CZT pixelated modules (not shown). For example, each module may be 4×4 cm in size and have 16×16=256 pixels. In some embodiments, each detector head 114 includes a plurality of modules, such as an array of 1×7 modules. However, different configurations and array sizes are contemplated including, for example, detector heads 114 having multiple rows of modules.

It should be understood that the imaging detectors 102 may be different sizes and/or shapes with respect to each other, such as square, rectangular, circular, or another shape. An actual field of view (FOV) of each of the imaging detectors 102 may be directly proportional to the size and shape of the respective imaging detector.

The gantry 104 may be formed with an aperture 118 (for example, opening or bore) therethrough as illustrated. The patient table 120 is configured with a support mechanism, such as the patient support structure 124, to support and carry the subject 110 in one or more of a plurality of viewing positions within the aperture 118 and relative to the imaging detectors 102. Alternatively, the gantry 104 may comprise a plurality of gantry segments (not shown), each of which may independently move a support member 112 or one or more of the imaging detectors 102.

The gantry 104 may also be configured in other shapes, such as a "C", "H", and "L", for example, and may be rotatable about the subject 110. For example, the gantry 104 may be formed as a closed ring or circle, or as an open arc or arch which allows the subject 110 to be easily accessed while imaging and facilitates loading and unloading of the subject 110, as well as reducing claustrophobia in some subjects 110. For example, in some embodiments the gantry 104 may be arc shaped and the support members 112 movable along the arc to position the detector heads 114 at different locations along the gantry 104. In some embodiments, the detector heads 114 may also be independently movable along the gantry 104.

Additional imaging detectors (not shown) may be positioned to form rows of detector arrays or an arc or ring around the subject 110. By positioning multiple imaging detectors 102 at multiple positions with respect to the subject 110, such as along an imaging axis (for example, head-to-toe direction of the subject 110) image data for a larger FOV may be acquired more quickly.

Each of the imaging detectors 102 has a radiation detection face, which is directed towards the subject 110 or a region of interest within the subject. The radiation detection faces are each covered by or have coupled thereto a collimator 122. The actual FOV for each of the imaging detectors 102 may be increased, decreased, or relatively unchanged by the type of collimator 122. In one embodiment, the collimator 122 is a multi-bore collimator, such as a parallel hole collimator. However, other types of collimators, such as converging or diverging collimators may optionally or alternatively be used. Other examples for the collimator 122 include pinhole, parallel-beam converging, diverging fan-beam, converging or diverging cone-beam, multi-bore converging, diverging fan-beam, converging or diverging cone-beam, multi-bore converging, multi-bore converging fan-beam, multi-bore converging cone-beam, multi-bore diverging, or other types of collimator.

Optionally, multi-bore collimators may be constructed to be registered with pixels of the detector heads 114, which in one embodiment are CZT detectors. However, other materials may be used. Registered collimation may improve spatial resolution by forcing photons going through one bore to be collected primarily by one pixel. Additionally, registered collimation may improve sensitivity and energy response of pixelated detectors as detector area near the edges of a pixel or in between two adjacent pixels may have reduced sensitivity or decreased energy resolution or other performance degradation. Having collimator septa directly above the edges of pixels reduces the change of a photon impinging at these degraded-performance locations, without decreasing the overall probability of a photon passing through the collimator.

A controller unit 130 may control the movement and positioning of the patient table 120, imaging detectors 102, gantry 104, and/or the collimators 122. A range of motion before or after an acquisition, or between different image acquisitions, is set to maintain the actual FOV of each of the imaging detectors 102 directed, for example, towards or "aimed at" a particular area or region of the subject 110 or along the entire subject 110.

The controller unit 130 may have a gantry motor controller 132, table controller 134, detector controller 136, pivot controller 138, and collimator controller 140. The controllers 130, 132, 134, 136, 138, 140 may be automatically commanded by a processing unit 150, manually controlled by an operator, or a combination thereof. The gantry motor controller 132 may move the imaging detectors 102 with respect to the subject 110, for example, individually, in segments or subsets, or simultaneously in a fixed relationship to one another. For example, in some embodiments, the gantry controller 132 may cause the imaging detectors 102 and/or one or more of the support members 112 to rotate about the subject 110, which may include motion of less than or up to 180 degrees (or more).

The table controller 134 may move the patient table 120 to position the subject 110 relative to the imaging detectors 102. The patient table 120 may be moved in up-down directions, in-out directions, and right-left directions, for example. The detector controller 136 may control movement of each of the imaging detectors 102 to move closer to and farther from a surface of the subject 110, such as by controlling translating movement of the detector carriers 116 linearly towards or away from the subject 110 (for example, sliding or telescoping movement). Optionally, the detector controller 136 may control movement of the detector carriers 116 to allow coordinated movement of the detector array 106 or 108. For example, the detector controller may control lateral movement of the detector carriers 116 illustrated by the L arrow (and shown as left and right as viewed in FIG. 1B).

The pivot controller 138 may control pivoting, rotating, or swinging movement of the detector heads 114 at ends of the detector carriers 116, the detector heads 114 under the patient support structure 124, and/or the detector carrier 116. For example, one or more of the detector heads 114 or detector carriers 116 may be rotated or swung about at least one axis to view the subject 110 from a plurality of angular orientations. The collimator controller 140 may adjust a position of an adjustable collimator, such as a collimator with adjustable strips (or vanes) or adjustable pinhole(s).

It should be noted that motion of one or more imaging detectors 102 may be in directions other than strictly axially or radially, and optionally, motions in several other motion directions may be used. Moreover, the motions of the imaging detectors 102 are coordinated in various embodiments as described herein. Therefore, the term "motion controller" may be used to indicate a collective name for all motion controllers. It should be noted that the various controllers may be combined, for example, the detector controller 136 and pivot controller 138 may be combined to provide the different movements described herein.

Prior to acquiring an image of the subject 110 or a portion of the subject 110, the imaging detectors 102, gantry 104, patient table 120, and/or collimators 122 may be adjusted as discussed in more detail herein, such as to first or initial imaging positions, as well as subsequent imaging positions. The imaging detectors 102 may each be positioned to image a portion of the subject 110. Alternatively, one or more of the imaging detectors 102 at ends of the detector arrays 106 and 108, which as illustrated in FIG. 1B are in a retracted position away from the subject 110 (in the detector array 106). Positioning may be accomplished manually by the operator and/or automatically, which may include using other images acquired before the current acquisition, such as by another imaging modality such as CT, MRI, X-Ray, PET, or ultrasound. Additionally, the detector heads 114 may be configured to acquire non-NM data, such as X-Ray or CT data.

After the imaging detectors 102, gantry 104, patient table 120, and/or collimators 122 are positioned, one or more images are acquired by one or more of the imaging detectors 102 being used, which may include pivoting or swinging motion of one or more of the detector heads 114, which may pivot, rotate, or swing to different degrees or between different ranges of angles. The image data acquired by each imaging detector 102 may be combined and reconstructed into a composite image, which may comprise two-dimensional (2D) images, a three-dimensional (3D) volume, or a 3D volume over time (4D).

In one embodiment, the imaging detectors 102, gantry 104, patient table 120, and/or collimators 122 remain stationary after being initially positioned. In another embodiment, an effective field of view for one or more of the imaging detectors may be increased by movement such as pivoting, rotating, or swinging one or more of the imaging detectors 102, rotating one or more of the detector arrays 106 and/or 108 with the gantry 104, adjusting one or more of the collimators 122, or moving the patient table 120.

In various embodiments, a data acquisition system (DAS) 160 receives electrical signal data produced by the imaging detectors 102 and converts this data into digital signals for subsequent processing. An image reconstruction device 162 and a data storage device 164 may be provided in addition to the processing unit 150. It should be noted that one or more functions related to one or more of data acquisition, motion control, data processing, and image reconstruction may be accomplished through hardware, software, and/or by shared processing resources, which may be located within or near the imaging system 100, or may be remotely located. Additionally, a user input device 166 may be provided to receive user inputs (for example, control commands), as well as a display 168 for displaying images.

Additionally, a detector position controller 165 is also provided, which may be implemented in hardware, software, or a combination thereof. For example, as shown in FIG. 1B, the detector position controller 165 may form part of or operate in connection with the processing unit 150. In some embodiments, the detector position controller 165 may be a module that operates to control the movement of the imaging detectors 102, including the detector heads 114, such that coordinated or synchronized movement is provided. It should be noted that movement of a plurality of the imaging detectors 102 and/or detector heads 114 may be performed at the same time (for example, simultaneously or concurrently) or at different times (for example, sequentially or step-wise, such as back and forth between two detector heads 114).

Figure 2:
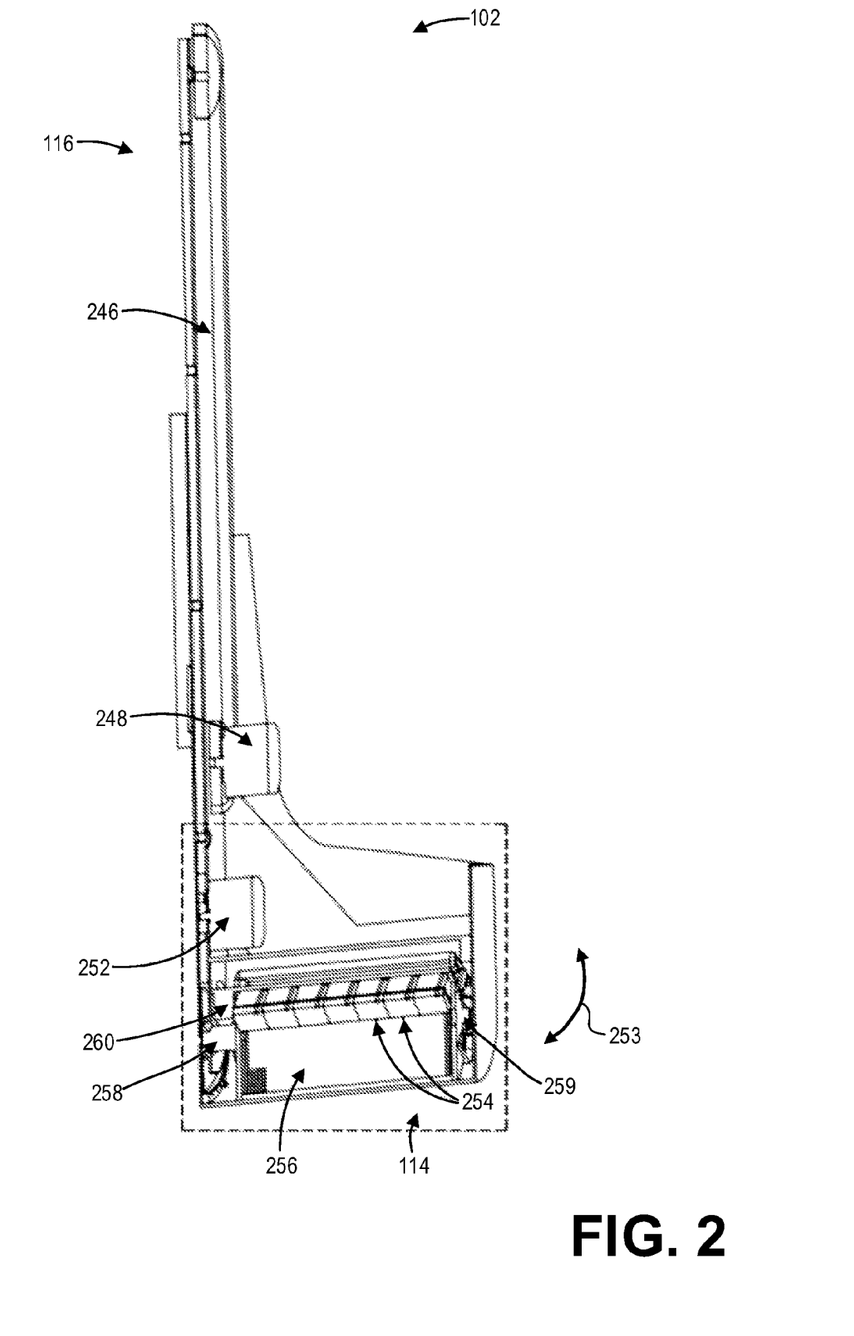
FIG. 2 shows a detailed view of an imaging detector according to an embodiment.

FIG. 2 shows a detailed implementation of imaging detector 102 in accordance with an embodiment. Detector carrier (e.g., arm) 116 attaches to a gantry and provides support for and includes a radial motion rail 246, radial motion motor 248, and detector head 114. The radial motion motor 248 controls the movement of the detector head 114 by extending or retracting the detector head 114 along the radial motion rail 246. This provides customizability and flexibility to the imaging system. The imaging detector 102 may include telescopic covers that allow it to extend and contract as it moves radially in and out.

The detector head 114 includes a sweep motor 252, detector elements 254, and collimator 256. The detector elements can be CZT modules or other detector element modules discussed throughout for detecting imaging data. Sweep motor 252 controls the rotation angle of the detector head 114 in relation to the carrier 116. The sweep pivoting axis 253 shows the rotation angle axis of the detector head 114. The detector controller 136 and/or pivot controller 138 can provide instruction and control to either or both of the radial motion motor 248 and sweep motor 252. Thus, each imaging detector 102 is independently controllable in the radial location as well as the angle of tilt of the detector head 114. The radial motion motor 248 and sweep motor 252 can be two separate motors as shown in the embodiment of FIG. 2. Alternatively, the functionality of the two motors may be provided by one motor.

Figure 7A:
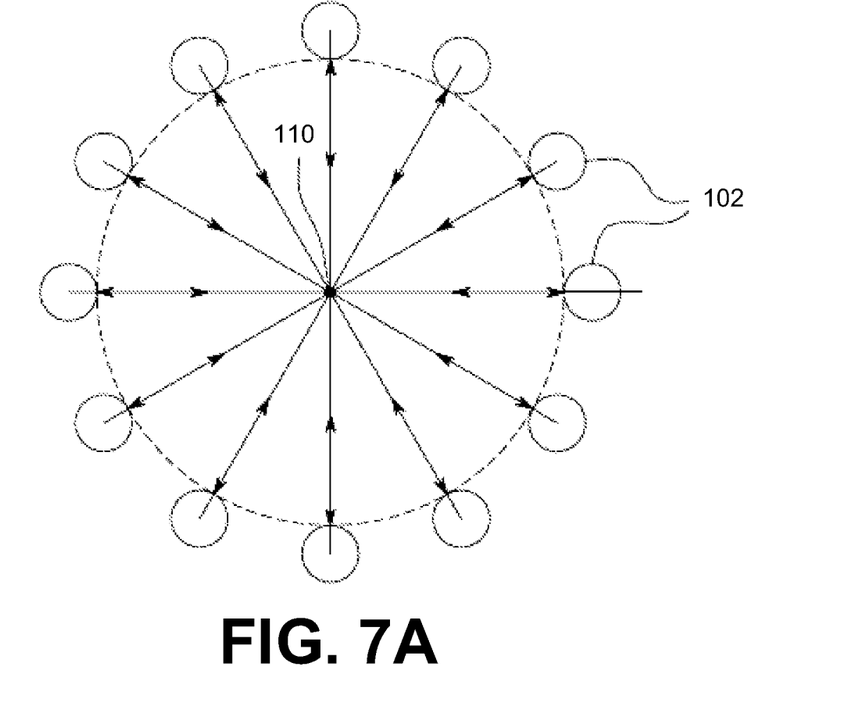
FIG. 7A is a diagram illustrating a radial construction and approach to image detection.

The imaging detectors may be arranged according to a suitable configuration in order to image a subject. FIG. 7A shows a radial construction of an imaging system where twelve detectors 102 are placed at a consistent angle, thirty degrees in this example, from each other along the inside of a gantry bore. Thus, the detectors 102 are uniformly distributed in this example. Each detector 102 is movable along a radial axis. This allows the detectors 102 to be closer or further from a subject 110 for imaging. The circles in the figure depict the location of the detector head 114 of a detector 102.

The detector columns are shown along the dotted line as their outer limit position in this view of one embodiment. The dual head radial arrows depict the in-out direction of motion of the detectors 102.

Detector head 114 may include detector electronics 260 attached to detector elements 254. Detector electronics 260 may include, for example: a digital readout board (not shown); an analog front-end (not shown) attached to the digital readout board, which may include analog signal manipulating circuitry that utilizes devices such as filters, amplifiers, and other electronic circuits; and so on.

Figure 7B:
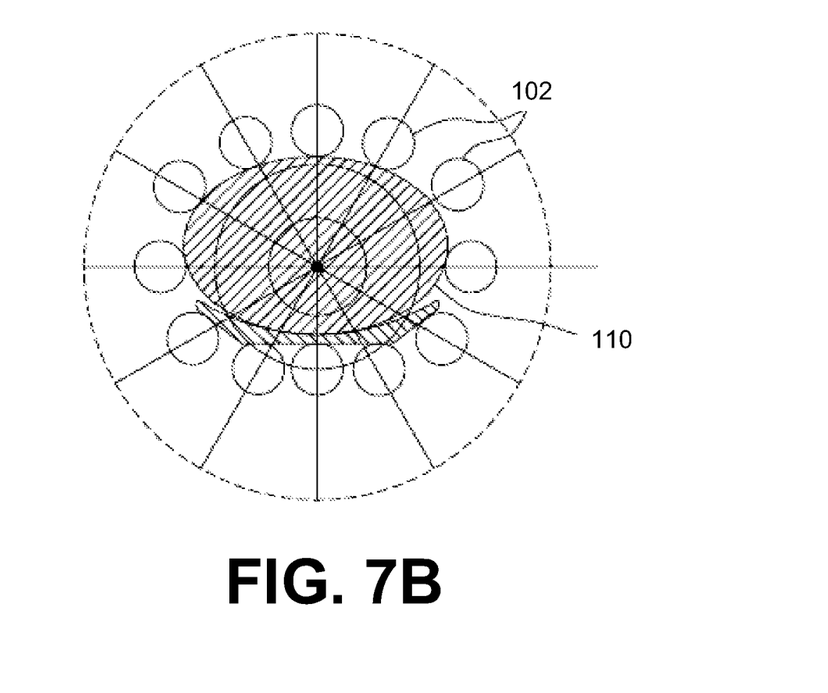
FIG. 7B is a diagram of the detector columns controlled to move at different points of their radial axis to best scan the specific shape of a subject.

FIG. 7B shows a radial construction where twelve detectors 102 have their heads placed at a consistent angle and have been moved radially inward to be in positions close to a subject 110. As FIG. 7B shows, some of the detector heads are further towards the center of their radial axis than others. This allows for high-quality imaging results with varied-sized objects.

Figure 8:
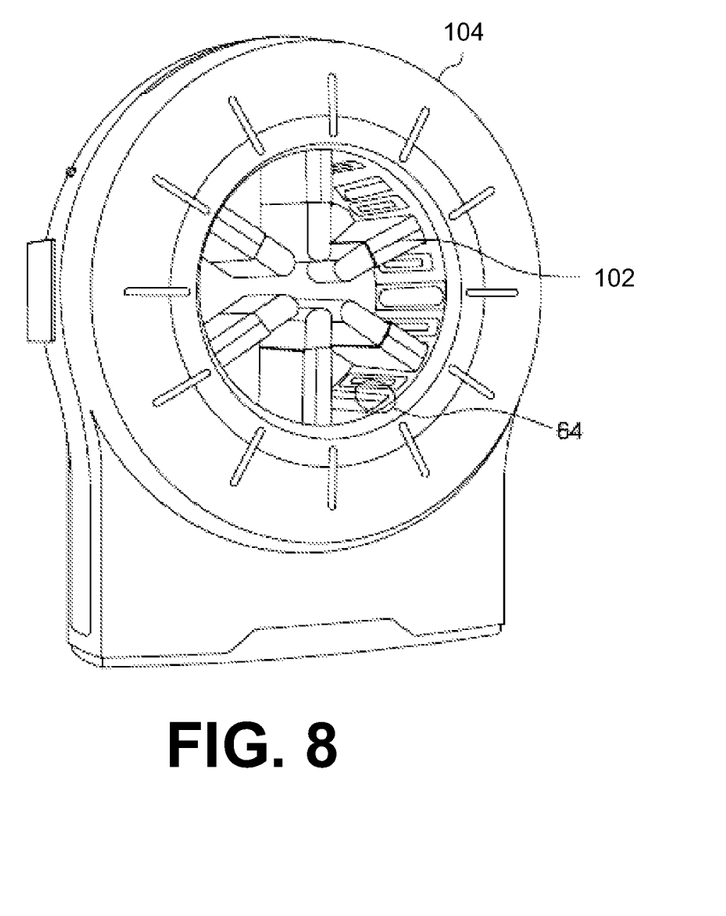
FIG. 8 is a perspective view of a gantry design with detector columns placed in a partially populated configuration.
Figure 9A:
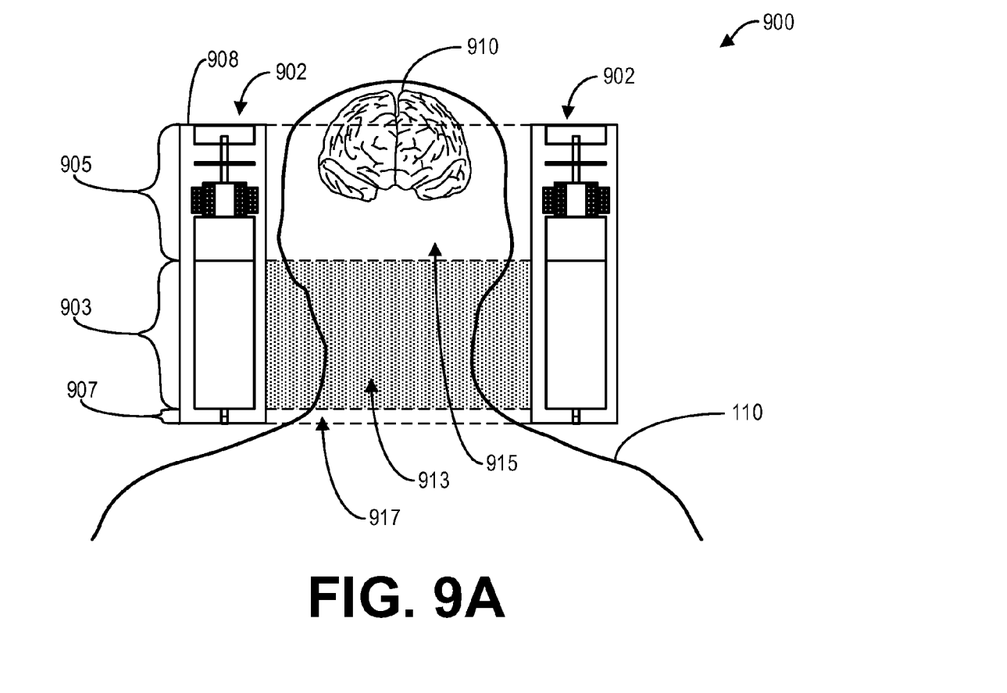
FIG. 9A shows a diagram illustrating an orientation of detector heads with respect to a subject to minimize a brain reach when imaging the subject's neck.
Figure 9B:
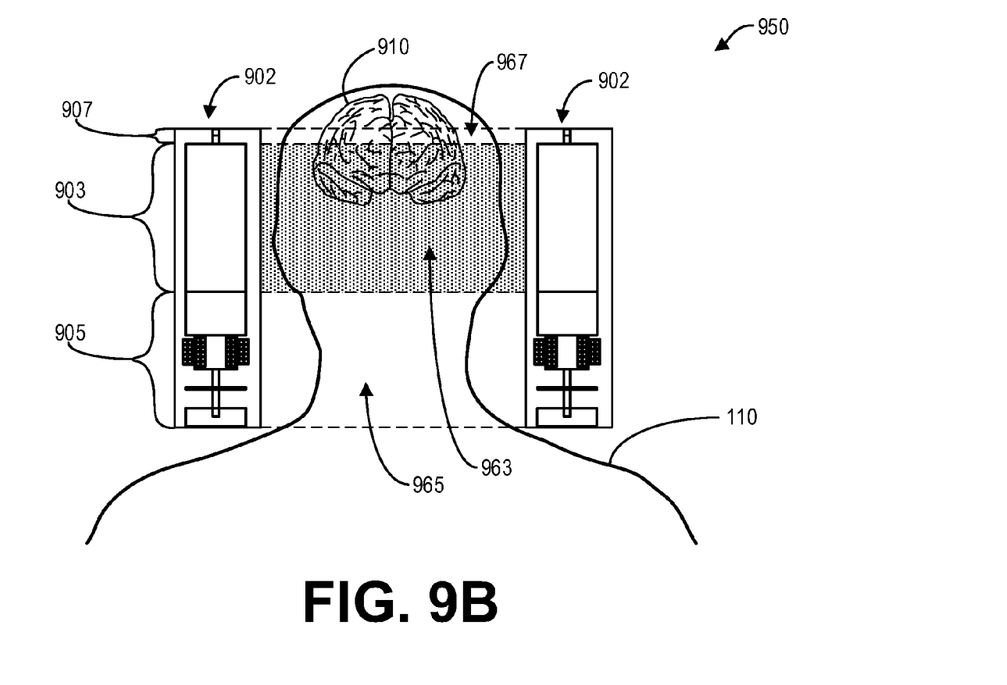
FIG. 9B shows a diagram illustrating an orientation of detector heads with respect to a subject to minimize a brain reach when imaging the subject's brain.

FIG. 8 shows a gantry 104 that can support twelve detectors 102. Only six detectors 102 have been installed in gantry 104. This could be for lower cost of the system, easier maintenance, or other reasons, for example. Thus, the system of FIG. 8 is a partially populated NM imaging system. It is partially populated because the installation information for the system indicates that the system can support twelve detectors 102, but only six detectors 102 are installed. The locations where a detector can be installed or attached can be called receiver locations 64 in some embodiments. The detectors 102 in FIG. 8 are shown in a radially extended position. The detectors 102 of this embodiment can be detached by a nontechnical operator. They can be detached from one of the twelve receiver locations 64 and snapped, screwed, clamped, or otherwise attached, to one of the open receiver locations 64 around the gantry 104. Thus, detectors 102 are detachable and attachable to create further system configurations. This system, in some embodiments, can be considered a modular system. A non-technical operator can be one who has not had specialized or advanced training on the installation and adjustment of the imaging system. A technical operator could be a field engineer, for example.

Installation information can be dynamically updated by processor or detector controller based on information from installation verification elements in receiver locations 64, and stored in a memory in one embodiment. Installation verification elements can be any sort of switch, button, sensor, or other device that detects the presence of hardware installed or not installed in the system. Installation verification elements of receiver locations 64 are one way that the system can detect and update installation information. Installation information in one embodiment relates to the detector arm being physically attached to gantry 104. Further, installation information in another embodiment detects both physical attachment plus a fully functioning arm. In this embodiment, if any of the radial motion motor, sweep motor, and/or detector elements are inoperable, even though the detector is attached to the gantry, the installation information could indicate the detector column as uninstalled and/or inoperable. Installation information can also indicate the population of specific detector Installation information is also called configuration information in some embodiments. This is because installation information gives information related to the current hardware configuration in the imaging system, and can be dynamically updated. Thus, installation information, sometimes called configuration information, is not just the initial setup information of the system when delivered to a customer, but is information dynamically updated based on many hardware factors throughout the lifetime of the system.

Returning to FIG. 2, and as described further herein, detector head 114 may comprise a simplified detector head that enables a more compact size with respect to previously-known detector heads. In this way, NM imaging system 100 may include an increased number of imaging detectors 102, thereby increasing imaging resolution. For example, a high voltage may be wirelessly supplied to detector head 114 to power detector electronics 260. In one example, detector head 114 may include a shaft (not shown) about which the detector electronics 260 rotate attached to rear bearing 258 and front bearing 259, as described further herein with regard to FIGS. 3 and 4. In another example, detector head 114 may include a pair of transformers that enable detector head to wirelessly receive power via inductive coupling, as described further herein with regard to FIG. 5. In this way, the detector head 114 may be able to freely rotate in any direction over a wide range of speeds.

In one example, detector head 114 may include one or more fans (not shown) to provide a cooling air flow throughout detector head 114. As described further herein with regard to FIGS. 3 and 6, such fans may work in conjunction with heat fins (not shown) attached to detector elements 254 and/or detector electronics 260 to circulate air and dissipate heat. In this way, a more efficient heat dissipation rate may be achieved, which in turn may enable the size of detector head 114 to be decreased without concern for damage of detector elements 254 and/or detector electronics 260 due to exposure to high temperatures.

In one example, collimator 256 may be glued to the detector elements 254. Gluing collimator 256 to detector elements 254 ensures the registration of collimator 256 to detector elements 254, and simplifies the attachment and replacement of detector modules. In this way, the need for accurate collimator alignment mechanics may be eliminated, and manufacturing as well as maintenance costs may be reduced.

FIG. 3 shows a schematic diagram of an example detector head 300 in accordance with the current disclosure. In particular, detector head 300 comprises a simplified detector head wherein a detector module 305 is wirelessly configured to receive power as well as receive and/or transmit data. Detector head 300 may be included in a NM imaging system 100, for example as one non-limiting example of detector head 114.

Detector head 300 may be enclosed by a housing, also referred to herein as a cover 308 to provide radiation shielding. In one example, cover 308 may comprise an extruded structural lead shield to provide radiation shielding. In another example, cover 308 may comprise an epoxy cast with tungsten powder. In this way, manufacturing cost of cover 308 is reduced and radiation shielding is improved.

In some examples, a portion 309 of cover 308 may provide less radiation shielding in order to allow radiation from a subject to reach a detector 303 (comprising a plurality of detector elements and a collimator, for example), so that the detector may absorb radiation for CT imaging. For example, portion 309 of cover 308 may provide no radiation shielding. The portion 309 may comprise a suitable portion of cover 308, such as having a length greater than an inch (e.g., greater than 25 mm), 10% of the entire circumference of cover 308, 50% of the length of the bottom wall of cover 308, or other suitable portion. For example, the area of portion 309 may equal the imaging area of detector 303, as depicted in FIG. 3.

FIG. 9A shows an example orientation 900 of detector heads 902 for imaging the neck and/or head of a subject 110. Each detector head 902 is enclosed by a cover 908 that provides radiation shielding as described hereinabove. In particular, cover 908 shields the regions 905 and 907 of detector head 902 that contain non-detector components, such as detector electronics and mechanical components of detector head 902, while providing less or no radiation shielding for at least a portion of region 903 containing detector components, such as detector elements and collimators. As described further herein, a majority of non-scanning components in a detector head 902 are positioned in region 905 of detector head 902, while region 907 contains as few non-scanning components as possible. Such a configuration of non-scanning components combined with the radiation shielding 908 produces two brain reach regions 915 and 917 between the detector heads 902, wherein the detector heads 902 and the subject 110 are isolated. In particular, the orientation 900 of detector heads 902 minimizes a brain reach 917, or more specifically, the distance from the edge of the detector head 902 to the scanned zone 913. In this way, detector heads 902 may be positioned close to the shoulders of subject 110, thereby allowing detector heads 902 to scan a larger portion of the neck of the subject 110.

FIG. 9B shows another example orientation 950 of detector heads 902 for imaging the brain 910 of a subject 110. Brain reach 965 is minimized such that the lower portion of the brain 910 may be positioned within the scanning zone 963. A different configuration of components within region 905 of detector heads 902, in contrast, may increase the brain reach 965 and 967, and as a result the lower portion of the brain 910 may not be located within the scanning zone 963.

Returning to FIG. 3, detector module 305 may include, for example, detector electronics 350 and detector 303. As described hereinabove with regard to FIG. 2, detector 303 may include detector elements and a collimator, while detector electronics 350 may include a digital readout board and an analog front-end.

Detector module 305 may be configured to swing, pivot, or rotate about a rotational axis while acquiring imaging data. Thus, detector module 305 may be fixed to a shaft 335, the shaft 335 defining the rotational axis of the detector module 305. The shaft 335 may be connected to a front bearing 359 and a rear bearing 358, wherein the rear bearing 358 may be connected to a pulley 331. Rotation motor 352 may drive a belt 317 attached to pulley 331, which in turn rotates shaft 335 and detector module 305.

In one example, electrical energy may be provided to detector module 305 via shaft 335. For example, a high voltage may be applied to rear bearing 358. The high voltage may then be conducted by shaft 335 to detector electronics 350. Front bearing 359 may be connected to ground in order to complete the circuit. Wirelessly providing electrical energy to detector module 305 by conducting a high voltage through shaft 335 is described further herein and with regard to FIG. 4.

In another example, electrical energy may be wirelessly provided to detector module 305 via inductive charging. For example, detector electronics 350 may further include one or more secondary inductive coils for wirelessly receiving electrical energy from a power supply via resonant inductive coupling, the power supply including one or more primary inductive coils such that the pair of inductive coils forms a transformer. The primary and secondary inductive coils may be coaxial with the rotational axis and positioned adjacent to detector electronics 350 such that the coils are shielded from the subject and to minimize a brain reach, or the distance from the edge of the detector head 300 to the edge of the detector head's field of view, of the detector head 300. Wirelessly providing electrical energy to detector module 305 via inductive charging is described further herein and with regard to FIG. 5.

In some examples, detector module 305 may wirelessly communicate with detector controller 136 and data acquisition system 160. For example, detector electronics 350 may further include a wireless receiver and/or transmitter, or transceiver 380, configured to receive control inputs from detector controller 136 and to transmit acquired imaging data to data acquisition system 160. Transceiver 380 may wirelessly communicate with a second transceiver 382. Transceiver 382 may be connected via a wireless or wired connection to detector controller 136 and/or data acquisition system 160. In this way, detector module 305 may wirelessly receive control inputs from detector controller 136 and may wirelessly send imaging data to data acquisition system 160, thereby eliminating any wired data cables connected to detector module 305. In one example, transceiver 382 may be mounted within the detector head 300 as shown. In such an example, transceiver 382 may move with respect to gantry 104, and therefore one or more flexible data cables may be connected to transceiver 382 to provide a flexible wired connection between transceiver 382, detector controller 136, and data acquisition system 160. In another example, transceiver 382 may be mounted to a moveable component of detector carrier 116, such as radial motion rail 246. In such an example, transceiver 382 may move with respect to gantry 104, and therefore one or more flexible data cables may be connected to transceiver 382 to provide a flexible wired connection between transceiver 382, detector controller 136, and data acquisition system 160. In yet another example, transceiver 382 may be mounted to a stationary part of detector carrier 116, or may be mounted to gantry 104. In such an example, one or more non-flexible data cables may be connected to transceiver 382 to provide a normal wired connection between transceiver 382, detector controller 136, and data acquisition system 160. Such wireless data communication may be enabled by a short-range wireless communication protocol, for example BLUETOOTH or near-field communication protocols, though any short-range wireless communication protocol, such as a short-range RF communication protocol, may be used.

In some examples, detector module 305 may be completely wireless. For example, detector head 300 may wirelessly receive/transmit data to/from detector module 305 and wirelessly provide electrical energy to detector module 305 as described herein. In this way, the rotation of detector module 305 may be completely unhindered by wired connections. For example, detector module 305 may freely rotate in one direction in a rotational distance greater than 360 degrees. As such, detector controller 136 may include additional speed commands such that detector module 305 may rapidly swing and increase the rate of data acquisition. In this way, detector head 300 may enable an increased imaging resolution and efficiency. In addition, without the need to insert wires into detector module 305, detector module 305 may be completely isolated from external environmental elements, such as dust.

In embodiments where detector module 305 is completely wireless and may therefore freely rotate, detector head 300 may include a relative encoder 340 to determine the orientation of the detector module 305. In contrast to wired detector modules which may use a bulky absolute encoder to ensure that the wired detector module does not rotate too far in one direction and break a wired connection, relative encoder 340 may be smaller and provide 12 bit-per-rotation accuracy. Relative encoder 340 may be mounted on shaft 335 and positioned adjacent to detector module 305. Relative encoder 340 may include a home marker to indicate a known position so that detector controller 136 may determine and calibrate the orientation of detector module 305 upon activating, or powering on. For example, the home marker may be located on the relative encoder 340 to indicate that the detector module is pointed away from the subject 110. Relative encoder 340 may include one or more photodetectors, for example, to measure the orientation of the detector module. Relative encoder 340 may be electrically connected to detector electronics 350 such that the detector orientation may be wirelessly transmitted to detector controller 136. In this way, backlash and belt stretch errors may be eliminated.

In some examples, detector head 300 may include one or more slip rings to provide a wired connection to detector module 305. The one or more slip rings may also enable detector module 305 to freely rotate a rotational distance greater than 360 degrees.

Detector head 300 may include one or more fans 325 to circulate air throughout detector head 300. Detector module 305 may include heat fins to dissipate heat from detector 303 and detector electronics 350. In this way, a more efficient heat dissipation rate may be achieved, which in turn may enable the size of detector head 300 to be decreased without concern for damage of detector module 305 due to exposure to high temperatures.

FIG. 4 shows a schematic diagram 400 illustrating power delivery to a detector head according to an embodiment. In particular, schematic diagram 400 depicts the delivery of a high voltage to detector module 305, which may include a detector and detector electronics, through mechanical components.

A voltage 410 may be applied to rear bearing 358, which is directly connected to shaft 335. The voltage 410 is conducted through shaft 335 to detector module 305. Detector module 305 may utilize the voltage 410 to power all internal electronics. Detector module 305 may include a converter 430 to appropriately convert the voltage 410 for use by detector module 305. For example, if voltage 410 is a DC voltage, converter 430 may comprise a DC-DC converter so that converter 430 may convert the voltage 410, for example 12 volts, to a high voltage, for example in the range of 400-1500 volts, to correctly bias the detector elements. As another example, if voltage 410 is an AC voltage, converter 430 may comprise an AC-DC converter to convert the supplied AC voltage 410 to one or more appropriate DC voltages for use by detector module 305. In this way, a small, well-regulated, and noise-free voltage 410 may be wirelessly supplied to detector module 305 and converted to an appropriate high voltage within detector module 305, thereby eliminating arcing hazards that may result from directly supplying a high voltage to detector module 305.

Voltage 410 is further connected to shaft 335 and front bearing 359. Front bearing 359 may be connected to ground 420, thereby completing the circuit.

Delivering electrical energy to the detector module 305 via conductive mechanical components such as shaft 335 may eliminate any need for a wired connection to detector module 305, for example via a flexible electrical connection. Sensitive detector electronics are thus not exposed to external environmental elements such as dust. Further, using the bearings 358 and 359 for power transfer in the way described herein enables a reduced size of the detector head as well as full rotation of the detector head without the possibility of incurring damage to any detector components.

The ability of the detector head to rotate more than 360 degrees about the shaft in one direction enables an efficient scanning method. For NM imaging systems wherein detector heads are wired and thus may not rotate more than 360 degrees, for example, during focused scanning a detector head may swivel to collect imaging data but may reverse direction in order to continuously scan. For example, such a detector head may stop and reverse direction each time the detector head is oriented away from the subject being scanned. In such an example, a scanning sequence for such limited detector head motion may comprise, for example: fast scanning of non-target tissue on the right side of the subject, slow scanning of the target tissue, fast scanning of non-target tissue on the left side, decelerate and stop, reverse direction, fast scanning of non-target tissue on the left side, slow scanning of target tissue, fast scanning of non-target tissue on the right side, decelerate and stop, reverse direction, and repeat. In contrast, the detector head of the present disclosure, such as detector head 300, may rotate more than 360 degrees in a clockwise or counter-clockwise direction about the rotational axis, thereby eliminating a need to stop and reverse direction. Further, the detector head 300 may swivel at a faster rate. For example, a scanning sequence for detector 300 may comprise: fast scanning of non-target tissue on the right side of the subject, slow scanning of target tissue, fast scanning of non-target tissue on the left side, accelerate to complete the rotation at very high speed, decelerate to fast speed, and repeat. Accelerating through the full rotation rather than stopping and reversing direction enables an increased amount of scanning during the same scan time. Further, motor power and thus motor wear is reduced.

FIG. 5 shows a block diagram illustrating an example detector head 500 wherein a detector module 305 receives electrical power via inductive coupling. In particular, detector head 500 includes a primary inductive coil 545 connected to a power supply and a secondary inductive coil 540 connected to the detector module 305, with both coils in close proximity and thus forming a transformer.

Stationary primary coil 545 may be coaxial with secondary coil 540 attached to the detector module 305 and thus rotatable about the axis of rotation. A voltage may be applied to primary coil 545 so that electrical energy may be transferred from primary coil 545 to secondary coil 540 as the secondary coil 540 rotates with the detector module 305.

In some examples, primary coil 545 and secondary coil 540 are located at the end of detector module adjacent to the encoder 340 and pulley 331, as depicted in FIG. 5. In this way, the brain reach of the detector head on the side of the inductive coils may be reduced. In this way, the detector head may be adapted to effectively image the brain, including regions of the neck, as described hereinabove with regard to FIGS. 9A and 9B. Further, in some examples, frequencies greater than 50 Hz may be used for compactness and efficiency.

FIG. 6 shows a diagram illustrating a head-on view of a detector head 600 equipped with a cooling system. In particular, detector head 600 includes a fan 625 that circulates air around a detector module 605. Detector head 600 may be included as part of an imaging system, such as the system illustrated in FIG. 1. Detector head 600 may be one non-limiting example of detector head 114 and/or detector head 300. As such, detector module 605 may include a detector comprising a plurality of detector elements and a collimator, as well as detector electronics, as explained above.

Cooling air flow 615 is pulled in to detector head 600 through gratings 606 of cover 608 via operation of fan 625. The gratings 606 may be positioned to direct the cooling air flow through the belt space of detector head (e.g., the space to accommodate the belt 317 illustrated in FIG. 3). The cooling air flow may then flow around detector module 605 via air duct 620 to form a tangential flow, which further enables a reduction of detector head size. The tangential air flow reduces a temperature gradient within the detector head, enabling efficient cooling for a narrower electronic module. The air flow may flow over fins 670, further cooling detector module 605. After passing over and/or around detector module 605, heated air exhaust 630 exits out of gratings 606 on the opposite side of where the cooling air flow entered.

In this way, the size of the detector head may be decreased, thereby also reducing the cost and complexity associated with manufacturing, operating, and maintaining the detector head.

The technical effect includes detecting radiation via a detector head, the detector head configured to rotate greater than 360 degrees about a shaft.

In one embodiment, a detector head for an imaging system comprises a detector module comprising at least one detector element for detecting radiation and detector electronics, in addition to a shaft to which the detector module is coupled, the detector module configured to rotate more than 360 degrees about the shaft in at least one direction. In one example, a voltage is conducted through the shaft and applied to the detector module. In another example, the detector module includes at least one inductive coil, the inductive coil configured to receive a voltage via inductive coupling.

In some examples, the detector module includes a transceiver, the transceiver configured to transmit imaging data to a data acquisition system via a short-range wireless protocol. In other examples, the detector head further includes at least one fan to circulate air around the detector module.

In one example, a relative encoder is attached to the shaft. In some examples, the detector module transmits detector orientation data from the relative encoder to a detector controller via a short-range wireless protocol. The relative encoder includes a home marker positioned to indicate when the detector module is oriented away from a subject.

In some examples, the detector head is a first detector head included in a first imaging detector configured to be coupled to a gantry via an arm. One or more second imaging detectors are coupled to the gantry, each of the one or more second imaging detectors comprising a respective detector head configured to rotate greater than 360 degrees about a respective shaft.

In some examples, the detector head is enclosed by an extruded structural lead shield. In other examples, the detector head is enclosed in a cast epoxy with tungsten powder.

In some examples, the detector module is configured to accelerate a rotation about the shaft when the detector module is oriented away from a subject during a focused scanning mode.

In another embodiment, a system, comprises a detector head. The detector head comprises: a rotational motor configured to rotate a shaft, a first end of the shaft attached to a first ball bearing and a second end of the shaft attached to a second ball bearing; and a detector module attached to the shaft, the detector module including at least one detector element for detecting radiation and configured to wirelessly receive electrical energy.

In some examples, a voltage is applied to the first ball bearing, and the detector module wirelessly receives electrical energy by the detector module receiving the voltage via the shaft. The second ball bearing is connected to ground.

In other examples, a first inductive coil is attached to the detector module and a second inductive coil is fixed to the detector head and coaxially positioned about the first inductive coil to induce a voltage in the first inductive coil.

In some examples, the system further comprises a data acquisition system, and the detector module transmits imaging data to the data acquisition system via a short-range wireless protocol.

In yet other examples, the system further comprises an arm, the detector head coupled to the arm, and wherein the detector head is configured to rotate greater than 360 degrees about an axis of rotation defined by the shaft.

In another embodiment, a detector head comprises a housing, a detector module configured to detect radiation, and at least one fan configured to circulate air throughout the housing of the detector head. The detector module is shaped as a cylinder, and the at least one fan is positioned to direct a tangential flow of air around the detector module. The detector head further comprises a plurality of heat fins coupled to the detector module.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A detector head for an imaging system, comprising:
   a detector module comprising at least one detector element for detecting radiation and detector electronics; and
   a shaft to which the detector module is coupled, the detector module configured to rotate more than 360 degrees about the shaft in at least one direction, wherein the detector head is configured to accelerate a rotation of the detector module about the shaft when the detector module is oriented away from a subject during a focused scanning mode.

2. The detector head of claim 1, wherein a voltage is conducted through the shaft and applied to the detector module.

3. The detector head of claim 1, wherein the detector module includes at least one inductive coil, the inductive coil configured to receive a voltage via inductive coupling.

4. The detector head of claim 1, wherein the detector module includes a transceiver, the transceiver configured to transmit imaging data to a data acquisition system via a short-range wireless protocol.

5. The detector head of claim 1, wherein the detector head further includes at least one fan to circulate air around the detector module.

6. The detector head of claim 1, wherein a relative encoder is attached to the shaft.

7. The detector head of claim 6, wherein the detector module transmits detector orientation data from the relative encoder to a detector controller via a short-range wireless protocol, and wherein the relative encoder includes a home marker positioned to indicate when the detector module is oriented away from a subject.

8. The detector head of claim 1, wherein the detector head is a first detector head included in a first imaging detector configured to be coupled to a gantry via an arm, and further comprising one or more second imaging detectors coupled to the gantry, each of the one or more second imaging detectors comprising a respective detector head configured to rotate greater than 360 degrees about a respective shaft.

9. The detector head of claim 1, further comprising an extruded structural lead shield enclosing the detector head.

10. The detector head of claim 1, wherein the detector head is enclosed in a cast epoxy with tungsten powder.

11. A system, comprising:
    a detector head comprising:
       a rotational motor configured to rotate a shaft, a first end of the shaft attached to a first ball bearing and a second end of the shaft attached to a second ball bearing; and
       a detector module attached to the shaft, the detector module including at least one detector element for detecting radiation and configured to wirelessly receive electrical energy; and
    an arm, the detector head coupled to the arm, wherein the detector head is configured to rotate greater than 360 degrees about an axis of rotation defined by the shaft.

12. A system, comprising:
    a detector head comprising:
       a rotational motor configured to rotate a shaft, a first end of the shaft attached to a first ball bearing and a second end of the shaft attached to a second ball bearing; and
       a detector module attached to the shaft, the detector module including at least one detector element for detecting radiation and configured to wirelessly receive electrical energy, wherein a voltage is applied to the first ball bearing, and the detector module wirelessly receives electrical energy by the detector module receiving the voltage via the shaft.

13. The system of claim 12, wherein the second ball bearing is connected to ground.

14. The system of claim 11, further comprising a first inductive coil attached to the detector module and a second inductive coil fixed to the detector head and coaxially positioned about the first inductive coil to induce a voltage in the first inductive coil.

15. The system of claim 11, further comprising a data acquisition system, and wherein the detector module transmits imaging data to the data acquisition system via a short-range wireless protocol.

16. The system of claim 12, further comprising an arm, the detector head coupled to the arm, and wherein the detector head is configured to rotate greater than 360 degrees about an axis of rotation defined by the shaft.

* * * * *